US006704913B2

(12) United States Patent
Rossman

(10) Patent No.: US 6,704,913 B2
(45) Date of Patent: Mar. 9, 2004

(54) IN SITU WAFER HEAT FOR REDUCED BACKSIDE CONTAMINATION

(75) Inventor: Kent Rossman, Orlando, FL (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/291,166

(22) Filed: Nov. 8, 2002

(65) Prior Publication Data

US 2003/0070619 A1 Apr. 17, 2003

Related U.S. Application Data

(62) Division of application No. 09/771,085, filed on Jan. 26, 2001, now Pat. No. 6,514,870.

(51) Int. Cl.[7] .............................................. G06F 17/50
(52) U.S. Cl. ........................................ 716/4; 118/715
(58) Field of Search .............................. 716/4; 118/715, 118/724–25; 700/121; 427/535; 117/104; 438/424, 716

(56) References Cited

U.S. PATENT DOCUMENTS

| | | | |
|---|---|---|---|
| 4,269,137 A | 5/1981 | Johnson | |
| 5,227,337 A | 7/1993 | Kadomura | |
| 5,494,854 A | 2/1996 | Jain | |
| 5,693,238 A | 12/1997 | Schmitt et al. | |
| 5,782,974 A | 7/1998 | Sorensen et al. | |
| 5,804,259 A | 9/1998 | Robles | |
| 5,937,323 A | 8/1999 | Orczyk et al. | |
| 5,968,610 A | 10/1999 | Liu et al. | |
| 6,056,825 A | 5/2000 | Sumnitsch | |
| 6,083,567 A | 7/2000 | Vesnovsky et al. | |
| 6,130,397 A | 10/2000 | Arai | |
| 6,162,709 A | 12/2000 | Raoux et al. | |
| 6,183,565 B1 | 2/2001 | Granneman et al. | |
| 6,221,781 B1 | 4/2001 | Siefering et al. | |
| 6,316,367 B1 | 11/2001 | Sumnitsch | |
| 6,559,026 B1 * | 5/2003 | Rossman et al. | 438/424 |
| 2001/0003064 A1 | 6/2001 | Ohio | |

FOREIGN PATENT DOCUMENTS

| | | |
|---|---|---|
| EP | 1 041 171 A1 | 4/2000 |
| JP | 62185877 | 8/1987 |
| JP | 10135186 | 5/1998 |
| WO | WO 96/33098 A | 10/1996 |

OTHER PUBLICATIONS

Weigand et al., "High Density Plasma CVD oxide deposition: the effect of sputtering on the film properties," VMIC Conference, Jun. 18–20, 1996; 1996 ISMIC—106/96/0075©, pp. 75–80.

Wei et al., "Characterization of High Density Plasma CVD USG Film," SPIE vol. 3214, pp. 94–103.

* cited by examiner

*Primary Examiner*—Craig A. Thompson
(74) *Attorney, Agent, or Firm*—Townsend and Townsend and Crew

(57) ABSTRACT

A substrate processing system and a computer-readable storage medium for directing operation of a substrate processing system are provided for preparing a substrate for processing. The substrate processing system has a chamber with a substrate receiving portion and systems equipped to implement plasma processes. The computer-readable storage medium has a program that directs operation of the systems. The substrate is positioned within the chamber in a location not on the substrate receiving portion. A gaseous flow is provided to the chamber, from which a plasma is struck to heat the substrate. After the substrate has been heated, it is moved to the substrate receiving portion for processing.

17 Claims, 6 Drawing Sheets

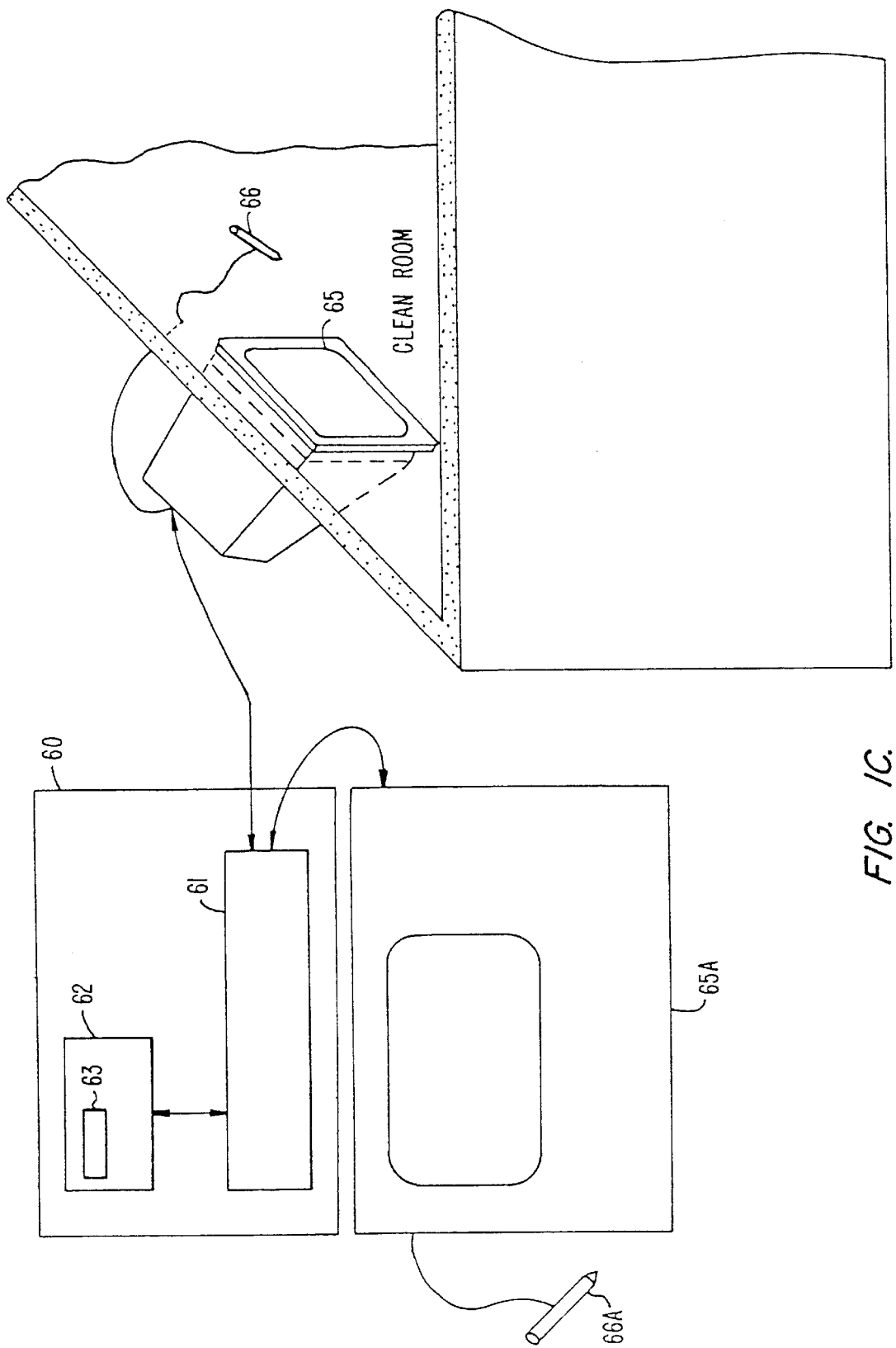
FIG. IC.

IN SITU WAFER HEAT FOR REDUCED BACKSIDE CONTAMINATION

This application is a Divisional application of U.S. Ser. No. 09/771,085 filed on Jan. 26, 2001 now U.S. Pat. No. 6,514,870.

BACKGROUND OF THE INVENTION

The present invention relates to the manufacture of integrated circuits on a substrate. More particularly, the invention relates to a method and apparatus for reducing backside contamination of substrates during processing.

One of the primary steps in the fabrication of modern semiconductor devices is the formation of a thin layer on a semiconductor substrate by chemical reaction of gases. Such a deposition process is referred to generally as chemical-vapor deposition ("CVD"). Conventional thermal CVD processes supply reactive gases to the substrate surface where heat-induced chemical reactions take place to produce a desired layer. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive. "High-density" is understood in this context to mean having an ion density that is equal to or exceeds $10^{11}$ ions/cm$^3$.

Because these processes are used in the precise manufacture of small-scale devices, it is especially desirable to limit the incidence of damage to the substrates during processing. Generally, silicon substrates used for processing are positioned onto a support, typically made of alumina, within a process chamber. The substrate is subject to expansion during processes that heat it with the plasma, which typically has a temperature of 400–800° C. While the heat of the plasma also causes the alumina support to expand, there may be a considerable difference in the degree of expansion of the silicon substrate when compared with the alumina support. This is because alumina has a lower coefficient of thermal expansivity than does silicon (or most other semiconductors) and because the alumina surface coating is actively cooled to at or near 65° C. The different expansions of the substrate and the support may result in scratching on the side of the substrate in contact with the support.

In some instances, the alumina support may be covered with a SiO$_2$ layer. The temperature changes resulting from the plasma heating may similarly cause damage to that layer, such that some SiO$_2$ flakes may adhere to the back side of the substrate. In further subsequent processing of the substrate, the flakes may fall off the substrate onto the front side of another substrate, thereby reducing overall device yield.

SUMMARY OF THE INVENTION

Embodiments of the invention are directed to a method for preparing a substrate that reduces the level of contamination of the back side of the substrate. The substrate is positioned within a chamber that has a substrate receiving portion, but in a location not on the substrate receiving portion. A gaseous flow is provided to the chamber, from which a plasma is struck to heat the substrate. After the substrate has been heated, it is moved to the substrate receiving portion for processing. In one embodiment, the plasma is a high-density plasma.

In certain embodiments, the substrate is positioned within the chamber by situating it on a plurality of lift pins, which may be electrically conductive. The substrate may then be moved to the substrate receiving portion when it is ready for processing by retracting the lift pins.

In some embodiments, the temperature of the substrate is monitored, with the substrate being moved to the substrate receiving portion when it reaches a predetermined temperature. This predetermined temperature may be the processing temperature at which the substrate is processed. The substrate temperature may be monitored by detecting infrared emission. In another embodiment, the substrate is moved to the substrate receiving portion after a predetermined time since striking the plasma has elapsed.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

A further understanding of the nature and advantages of the present invention may be realized by reference to the remaining portions of the specification and the drawings.

BRIEF DESCRIPTION OF THE DRAWINGS

In the figures, similar components and/or features may have the same reference label. Where reference is made in the detailed description to a figure without specifying a particular subpart, the reference is intended to refer collectively to all subparts of the figure.

FIG. 1C is a simplified diagram of a monitor and light pen that may be used in conjunction with the exemplary CVD processing chamber of FIG. 1A.

DESCRIPTION OF THE SPECIFIC EMBODIMENTS

I. Introduction

Embodiments of the present invention are directed to a method and apparatus for reducing the incidence of substrate backside contamination. In particular, embodiments of the invention use a set of lift pins to keep the substrate above the substrate receiving portion while it is heated by the plasma. The lift pins are made of a material having an electric conductivity sufficient to mitigate any storing of charges from the plasma, but not so electrically conductive as to produce arcing from the plasma. The wafer may be cooled by radiation and a small amount of heat conduction through the conductive lift pins. In the case of higher chamber pressures, a small amount of convective and/or conductive heat transfer may also occur with the gases supporting the plasma.

II. Exemplary Substrate Processing System

Figure 1A:
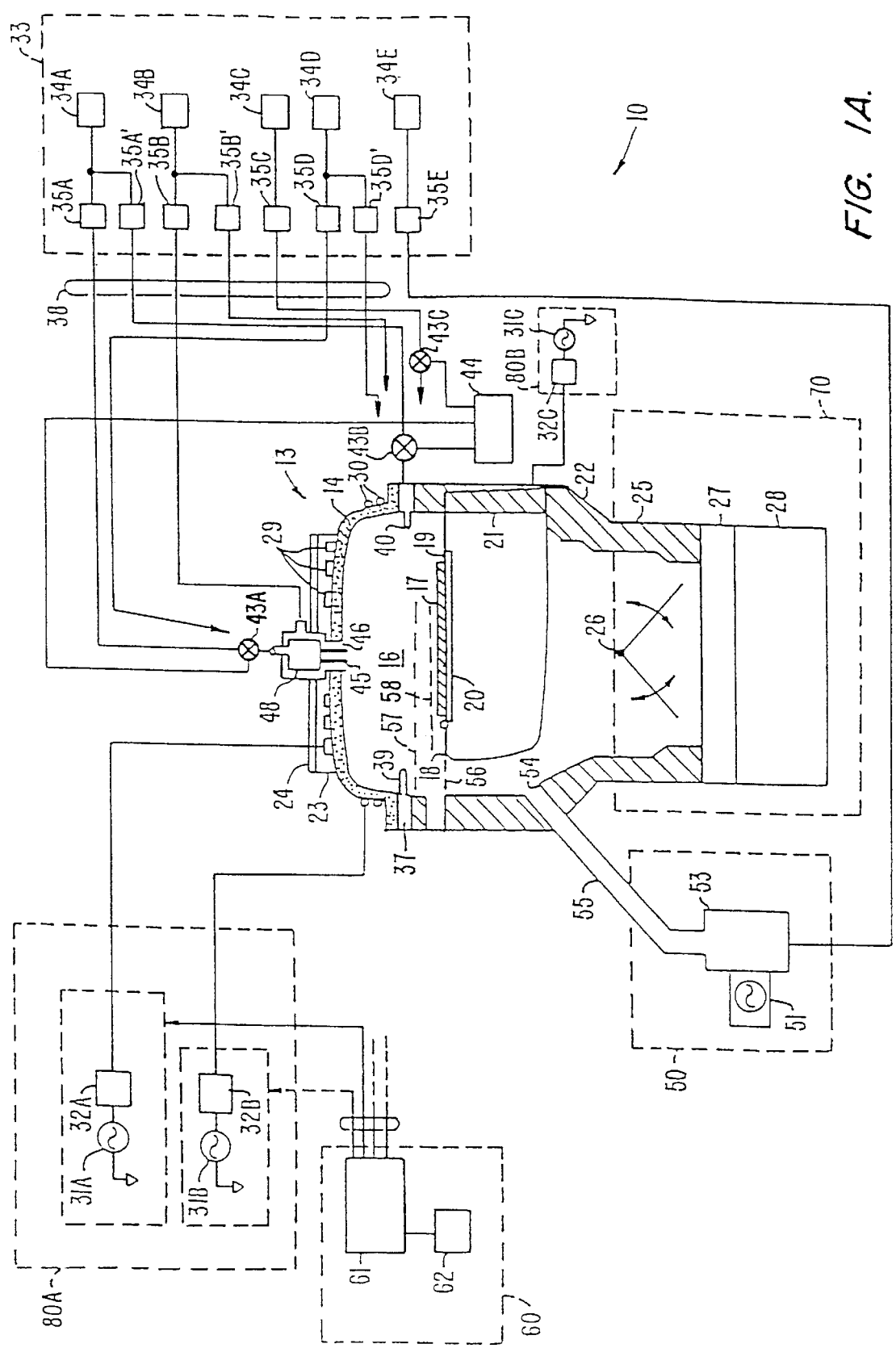
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a substrate can be processed according to the present invention. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (shown in FIG. 2) are raised and then lowered under the control of a motor (not shown) to move the substrate to different positions within the chamber 13. The lift pins may be configured to move the substrate from the robot blade at an upper loading position 57 to a pre-processing position 58 where, as explained further below, the substrate is prepared for processing. Subsequently, the lift pins may move the substrate to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 5,000 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
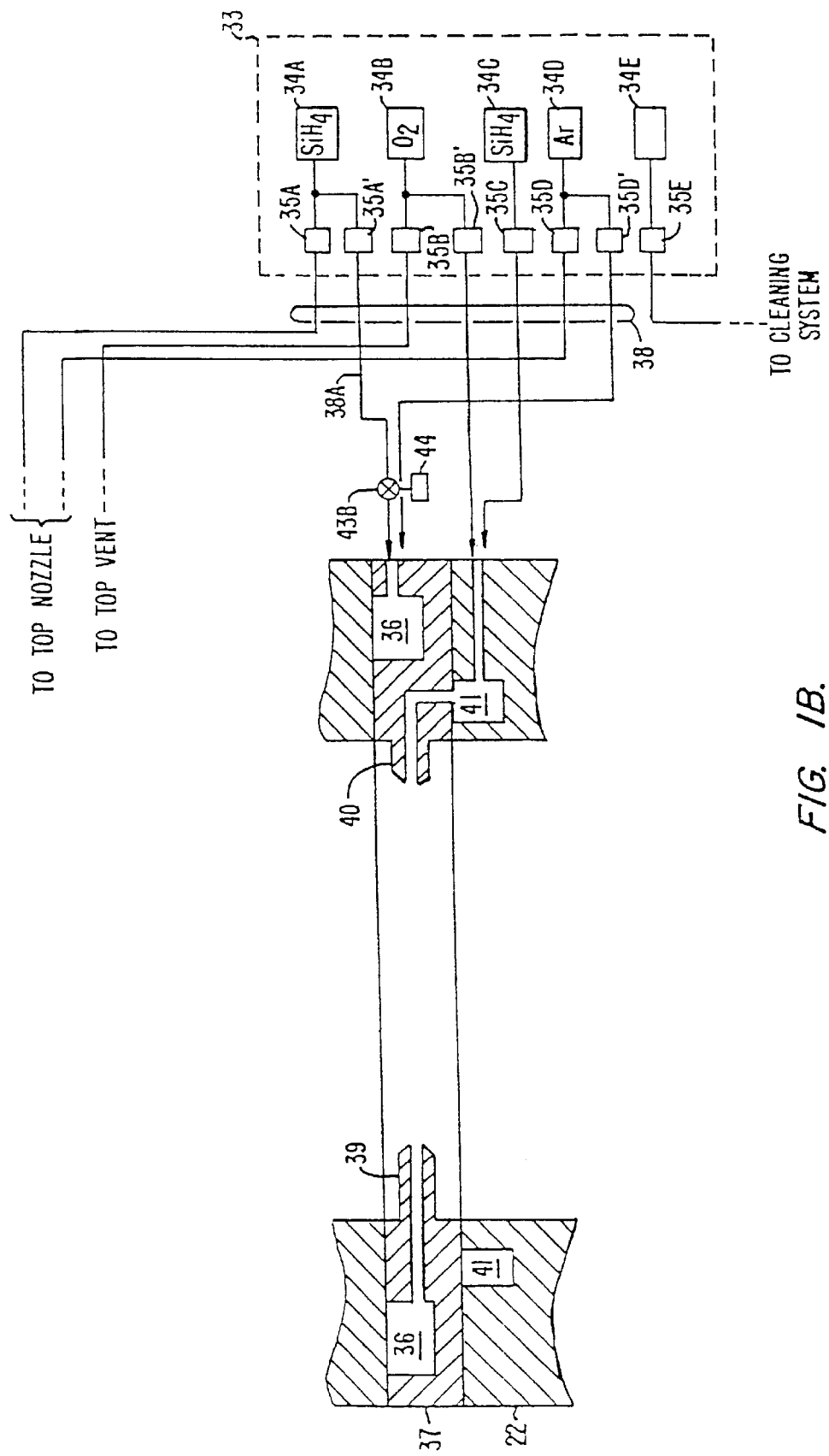
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
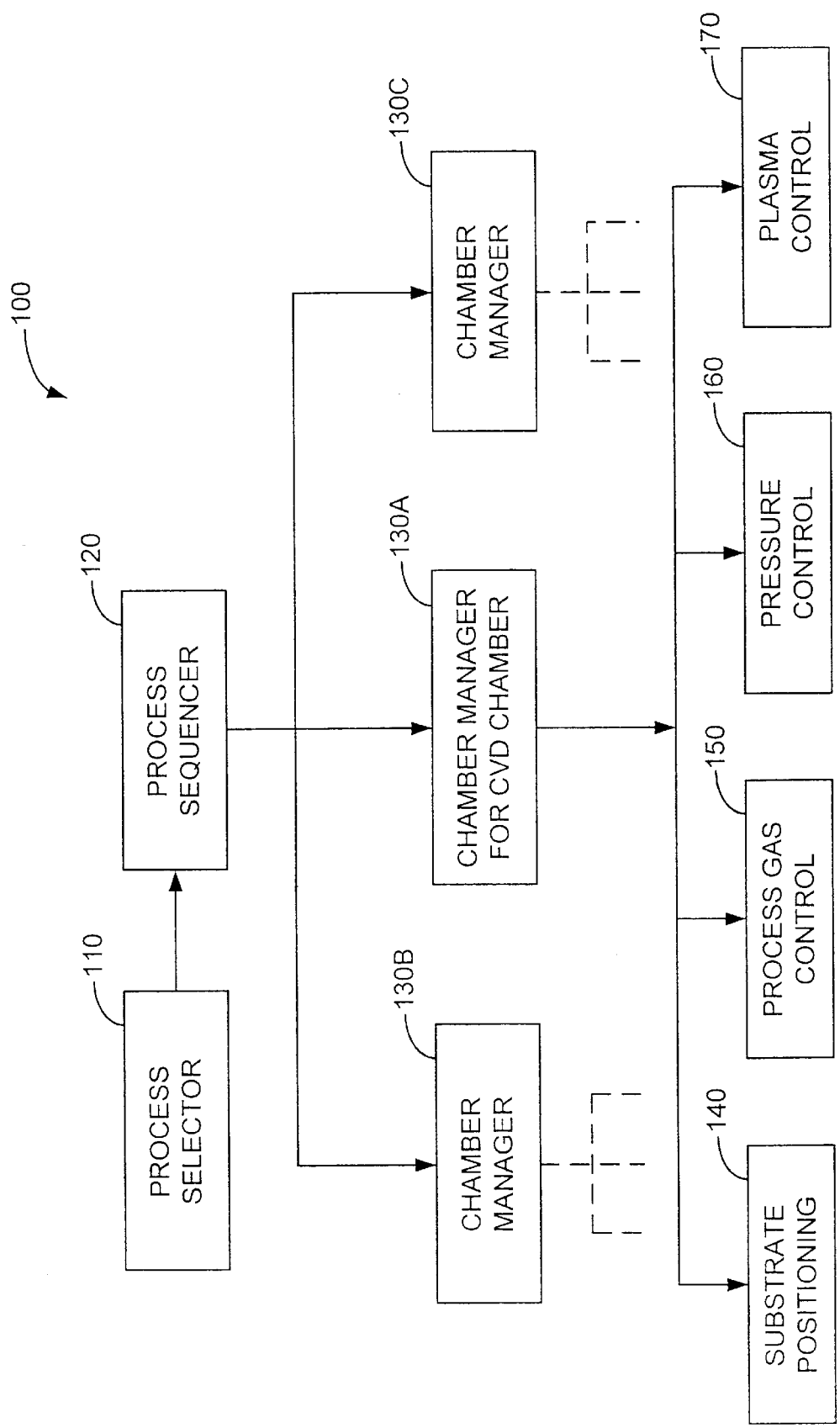
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Substrate Preparation

Preparation of the substrate before processing is used to reduce the possibility of contamination and damage to the back side of the substrate. In particular, embodiments of the invention heat the substrate from room temperature approximately to the process temperature, within the process chamber, before the substrate is brought in contact with the substrate receiving portion 19. With the wafer temperature near the process temperature, any expansion of the substrate has already occurred so the possibility of inconsistent expansion between the substrate and the substrate receiving portion is essentially removed. The result is that damage to and/or contamination of the back side of the substrate is substantially reduced during processing. One means of heating the substrate to the desired temperature before bringing it in contact with the substrate receiving portion is to support it with lift pins that can be recessed into the substrate receiving portion.

Figure 2A:
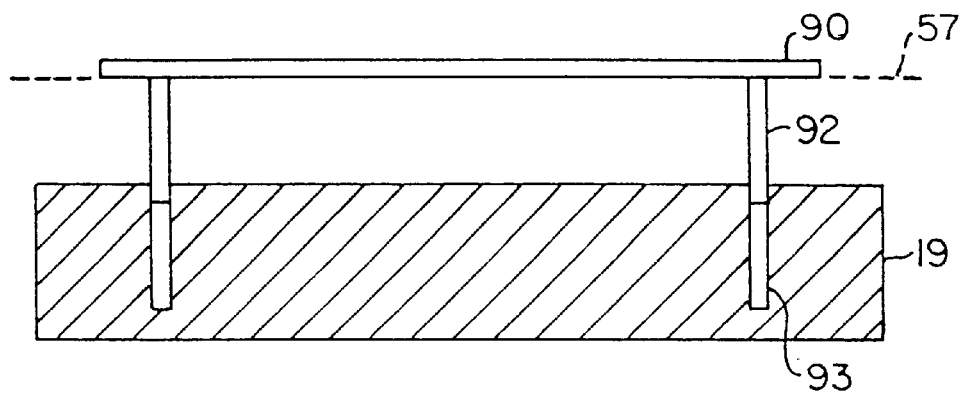
FIG. 2(a) is a simplified diagram showing the position of a substrate and lift pins in a loading position.
Figure 2B:
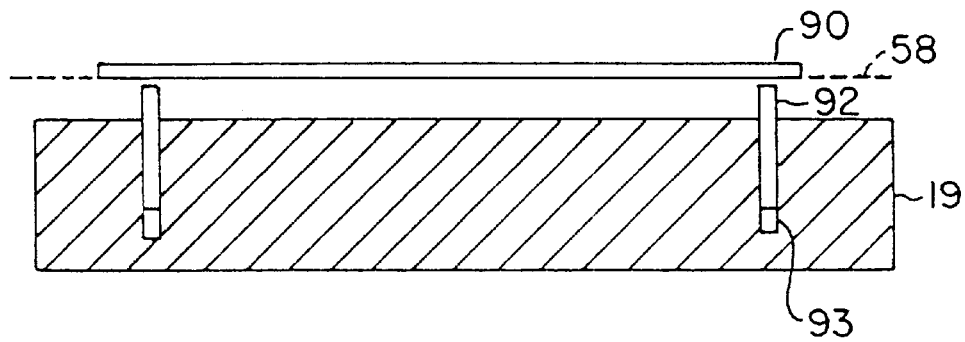
FIG. 2(b) is a simplified diagram showing the position of a substrate and lift pins in a pre-processing position.
Figure 2C:
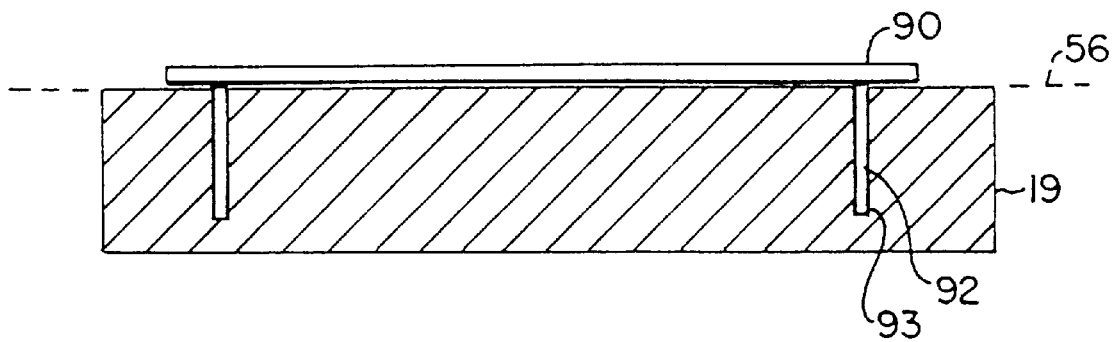
FIG. 2(c) is a simplified diagram showing the position of a substrate and lift pins in a processing position.

An example illustrating the operation of such lift pins is shown in FIG. 2, where the various components are not shown to scale. As configured in the example, the lift pins 92 are adapted to position the substrate 90 in one of three positions relative to the substrate receiving portion. The lift pins 92 may reside within chambers 93 and be driven with a motor (not shown) such that the three positions are achieved by moving the lift pins 92 out from or into the substrate receiving portion a specific distance. In a first position, shown in FIG. 2(*a*), the lift pins 92 are positioned such that the substrate 90 can be received from the robot blade at the upper loading position 57. The upper loading position 57 is determined so as to be convenient for receiving the substrate 90 from the robot blade. In a second position, the pre-processing position 58 shown in FIG. 2(*b*), the lift pins 92 are further recessed into the substrate receiving portion 19 and positioned so that the substrate 90 is not in contact with the substrate receiving portion 19. In a third position, shown in FIG. 2(*c*) as the processing position 56, the substrate 90 is in contact with the substrate receiving portion 19, where it may be electrostatically chucked into a secure position for processing.

Figure 3:
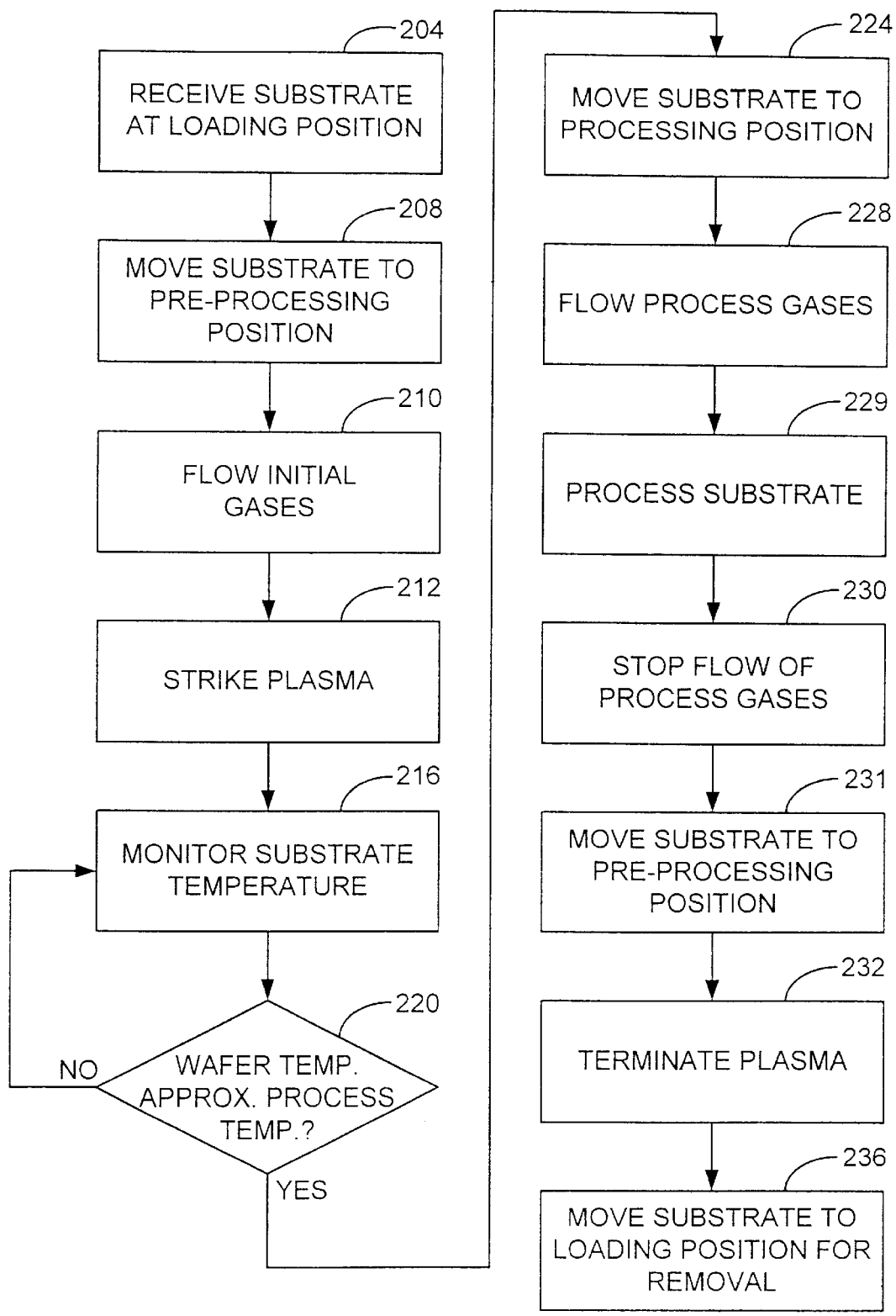
FIG. 3 is a flow diagram illustrating steps in one embodiment of the invention.

Certain aspects of the invention may be understood more fully with reference to FIG. 3, which is a flow diagram depicting a particular embodiment. At step 204, the substrate 90 is received within the chamber 13 at the upper loading position 57, resting on the lift pins 92. The substrate 90 is then moved to the pre-processing position 58 at step 208 by lowering the lift pins. For a circular 200 or 300 mm substrate in the pre-processing position 58, the substrate 90 may be approximately 50–150 mil above the substrate receiving portion 19. If higher than about 150 mil, the substrate 90 may acquire a charge from the plasma before deposition gases are introduced into the chamber 13. The lower limit is dictated primarily by the range of electrostatic forces from the electrostatic chuck. There is no a priori limitation on how close the substrate 90 may be to the substrate receiving portion 19 provided there is no contact between them, with the substrate remaining unchucked.

Once the substrate 90 is properly positioned, initial gases are flowed into the process chamber at step 208. Such initial gases may include, for example, an inert gas such as argor from which a plasma may be struck at step 212. The plasma may be a high-density plasma, which is understood in this context to mean having an ion density that is equal to or exceeds $10^{11}$ ions/cm$^3$. The substrate 90 is heated by the plasma, and the temperature of the substrate 90 is monitored at step 216. A small amount of heat may radiate away from the substrate 90 and some may be conducted through the lift pins 92. In the case of higher chamber pressures, there may additionally be a small amount of convective or conductive heat transfer with the gases supporting the plasma. There are various methods for monitoring the substrate temperature, and the invention is not limited by a particular method. For example, the substrate receiving portion 19 may be configured with an infrared sensor. With the substrate 90 sufficiently close to the infrared sensor, the temperature may be measured from infrared emissions from the substrate 90, perhaps with reference to previously derived correlations established for certain separations between the substrate and the infrared sensor. In an alternative embodiment, a fixed time period is used to allow the substrate 90 to reach the desired temperature. That time may be optimized, for example, by examining process output parameters or by examining the incidence of backside contamination on the substrate after it has been processed. Such incidence is minimized when the substrate is heated by the plasma for the optimal time.

There are several considerations useful in determining the specific structure of the lift pins 92. In one embodiment, they are configured to be electrically conductive. This has the effect of grounding the outer surface of the substrate 90, thereby suppressing the accumulation of charge on the substrate 90 while it is in direct contact with the plasma. The conductivity of the lift pins 92 is preferably within a range sufficient to prevent charge accumulation but not so large that there is a danger of arcing with the plasma. If the electrical conductivity is too low, the lift pins may be too resistive to ground the substrate 90 sufficiently, while conductivity that is too high increases the possibility of indesireable arcing.

A further consideration involves balancing the desire to minimize the contact area with the substrate 90 while also providing adequate support to the substrate 90. This may be accomplished by varying several parameters, including the cross-sectional area of the lift pins 92 as well the number of lift pins 92. To minimize contact area, the lift pins 92 may be beveled where they contact the substrate in some embodiments. In one embodiment, four lift pins are used in a square configuration to support a circular substrate. In one embodiment suitable for processing a circular substrate having a nominal diameter of 300 mm, each of the lift pins has a circular cross section with a diameter less that 1 cm. The material used to fabricate the lift pins 92 should be chosen so that it will not be damaged by the plasma nor will contaminate the plasma. Appropriate materials include alumina or SiC. Once it is determined at step 220 that the substrate temperature has reached the desired level, i.e. approximately at the process temperature to be used subsequently, the substrate 90 is moved to the processing position 56 at step 224.

When in the processing position 56, the substrate 90 is in contact with the substrate receiving portion 19, where it may be secured by electrostatic chucking. The process gases are then flowed into the chamber 13 at step 228 to perform the desired processing, such as deposition or etching, on the substrate 90 at step 229. Once the substrate has been processed, the flow of process gases is stopped at step 230 without terminating the plasma. The substrate is subsequently returned to the pre-processing position at step 231 so that it remains in contact with the plasma in order to allow charges to expel. At step 232, the plasma is terminated and the substrate is then moved back to the loading position at step 236 by decoupling the electrostatic chuck 20 and moving the lift pins 92. At this point, the processed substrate can be removed from the chamber 13. The time interval between steps 232 and 236 should be short so that there is insufficient time for the processed substrate and the substrate receiving portion 19 to contract at different rates.

This process may be clarified with a specific example in which embodiments of the invention are used for deposition of a layer on a substrate 90. In such an embodiment, a flow of substantially inert gas is provided into the chamber 13, from which a plasma is formed. The substrate 90 is maintained in the preprocessing position 58 while it is heated by the plasma. Once heated, the substrate 90 is moved to the substrate receiving portion 19. Deposition gases for forming the layer on the substrate 90 are flowed into the chamber 13 only after the substrate has been moved to the substrate receiving portion 19. A similar procedure may be used for embodiments used to etch a substrate 90, with additional gases being provided to the chamber 13 for etching only after the substrate has been heated by the plasma and moved to the substrate receiving portion 19. As used herein, "substantially inert gas" refers to a gas or combination of gases that does not result in appreciable processing of the substrate 90, i.e. does not result in appreciable deposition for a deposition process or does not result in appreciable etching for an etch process.

In one alternative embodiment, instead of having a single set of lift pins configured to move the substrate to at least three different positions, a plurality of sets of lift pins may be provided, each having only two positions. Thus, one set of lift pins may be used to move the substrate between the upper loading position and the substrate receiving portion while another may be used to move the substrate between the pre-processing position and the substrate receiving portion. Other configurations may also be used.

Having described several embodiments, it will be recognized by those of skill in the art that various modifications, alternative constructions, and equivalents may be used without departing from the spirit of the invention. In particular, while embodiments have been described in detail for high-density plasma system, ,those of skill in the art will recognize the general applicability of the invention to any substrate processing system that uses a plasma to heat the substrate. Accordingly, the above description should not be taken as limiting the scope of the invention, which is defined in the following claims.

What is claimed is:

1. A computer-readable storage medium having a computer-readable program embodied therein for directing operation of a substrate processing system including a chamber having a substrate receiving portion; a plasma generation system; and a gas delivery system configured to introduce gases into the chamber, the computer-readable program including instructions for operating the substrate processing system to process a substrate disposed in the chamber in accordance with the following:

receiving the substrate within the chamber not on the substrate receiving portion;

providing a gaseous flow to the chamber;

striking a plasma from the gaseous flow to heat the substrate; and moving the substrate to the substrate receiving portion for processing after the substrate has been heated by the plasma.

2. The computer-readable storage medium recited in claim 1 wherein the substrate receiving portion includes a plurality of retractable lift pins, wherein receiving the substrate within the chamber comprises receiving the substrate on the lift pins, and wherein moving the substrate to the substrate receiving portion comprises retracting the lift pins within the substrate receiving portion.

3. The computer-readable storage medium recited in claim 1 wherein the substrate processing system further includes an infrared sensor, and wherein the computer-readable program further includes instructions for operating the infrared sensor to monitor a temperature of the substrate and to perform the step of moving the substrate to the substrate receiving portion when the substrate has reached a predetermined temperature.

4. A substrate processing system comprising:

a housing defining a chamber;

a plasma generating system operatively coupled to the chamber;

a substrate receiving portion within the chamber configured to hold a substrate during substrate processing;

a gas-delivery system configured to introduce gases into the chamber;

a pressure-control system for maintaining a selected pressure within the chamber;

a controller for controlling the plasma generating system, the gas-delivery system, and the pressure-control system; and a memory coupled to the controller, the memory comprising a computer-readable medium having a computer-readable program embodied therein for directing operation of the substrate processing system, the computer-readable program including instructions to receive the substrate within the chamber not on the substrate receiving portion;

instructions to provide a gaseous flow to the chamber;

instructions to strike a plasma from the gaseous flow to heat the substrate; and instructions to move the substrate to the substrate receiving portion for processing after the substrate has been heated by the plasma.

5. The substrate processing system recited in claim 4 wherein the substrate receiving portion includes a plurality of retractable lift pins, wherein the instructions to receive the substrate within the chamber include instructions to receive the substrate on the lift pins, and wherein the instructions to move the substrate to the substrate receiving portion include instructions to retract the lift pins within the substrate receiving portion.

6. The substrate processing system recited in claim 4, further comprising an infrared sensor, wherein the computer-readable program further includes instructions for operating the infrared sensor to monitor a temperature of the substrate, and wherein the instructions to move the substrate to the substrate receiving portion are executed when the substrate has reached a predetermined temperature.

7. The computer-readable storage medium recited in claim 2 wherein the retractable lift pins are electrically conductive.

8. The computer-readable storage medium recited in claim 2 wherein the lift pins are composed of alumina.

9. The computer-readable storage medium recited in claim 2 wherein the lift pins are composed of AlN.

10. The computer-readable storage medium recited in claim 2 wherein the lift pins are composed of SiC.

11. The computer-readable storage medium recited in claim 1 wherein the plasma is a high-density plasma.

12. The computer-readable storage medium recited in claim 1 wherein moving the substrate to the substrate receiving portion is performed a predetermined time after striking the plasma.

13. The substrate processing system recited in claim 5 wherein the retractable lift pins are electrically conductive.

14. The substrate processing system recited in claim 5 wherein the retractable lift pins are composed of AlN.

15. The substrate processing system recited in claim 5 wherein the retractable lift pins are composed of SiC.

16. The substrate processing system recited in claim 4 wherein the plasma is a high-density plasma.

17. The substrate processing system recited in claim 4 wherein the instructions to move the substrate to the substrate receiving portion are executed a predetermined time after striking the plasma.

* * * * *